United States Patent [19]

Pittenger

[11] 4,335,272

[45] Jun. 15, 1982

[54] BREAKAWAY CIRCUIT BOARD WITH FLEXIBLE COUPLING

[75] Inventor: Daniel I. Pittenger, Libertyville, Ill.

[73] Assignee: Zenith Radio Corporation, Glenview, Ill.

[21] Appl. No.: 172,921

[22] Filed: Jul. 28, 1980

[51] Int. Cl.³ .............................................. H05K 1/02
[52] U.S. Cl. .................................................... 174/68.5
[58] Field of Search ........................................ 174/68.5

[56] References Cited

U.S. PATENT DOCUMENTS

| | | | |
|---|---|---|---|
| 3,716,846 | 2/1973 | Volckart | 174/68.5 X |
| 3,780,430 | 12/1973 | Feeney | 174/68.5 X |
| 3,780,431 | 12/1973 | Feeney | 174/68.5 X |
| 4,227,238 | 10/1980 | Saito | 361/398 X |

FOREIGN PATENT DOCUMENTS

| | | | |
|---|---|---|---|
| 1061862 | 7/1959 | Fed. Rep. of Germany | 174/68.5 |
| 938327 | 10/1963 | United Kingdom | 174/68.5 |

*Primary Examiner*—Richard R. Kucia
*Attorney, Agent, or Firm*—Jack Kail

[57] ABSTRACT

Disclosed is a perforated circuit board with a linear arrangement of paired terminals through which jumper wires are inserted and which are positioned on each side of and adjacent to the perforations. The perforations permit flexible "breaking" of the circuit board into sections which may be oriented at any angle relative to one another while the machine-inserted jumper wires provide structural integrity and rigidity for the circuit board arrangement thus formed in addition to electrical coupling between adjacent board sections.

8 Claims, 4 Drawing Figures

BREAKAWAY CIRCUIT BOARD WITH FLEXIBLE COUPLING

BACKGROUND OF THE INVENTION

This invention relates generally to circuit board interconnections, and particularly relates to a coupled circuit board configuration which provides adjoining board positioning flexibility together with structural integrity and electrical connection.

The rapidly increasing sophistication of electronic devices has been made possible by a number of technological advances. One area in which advances have led to enhanced electronics capabilities is that of device packaging and component layout. The component-dense circuit board and circuit board stacking arrangements have permitted the designer to incorporate more functions and more sophisticated operations per unit volume. Of course, thermal dissipation must be dealt with in these more densely packaged devices, but more efficient component design and materials in addition to increased micro-miniaturization have reduced the heat generated in this environment.

Circuit board layout and fabrication, including the placement of components and conductors thereon, is increasingly being accomplished by automated processes many of which are computer-controlled. Perhaps the greatest limitation on advances in this area has involved the interconnecting of individual circuit boards. This has resulted in the placing of restrictions on the circuit board designer and manufacturer in terms of relative board orientation to accommodate a unique environment or application, interconnecting board rigidity combined with large numbers of inter-board connectors, and high speed automated methods of manufacturing multi-board configurations with a minumum amount of material and expense. Finally, it is to be noted that interboard spacing and configuration plays another important role in terms of the access provided to board components and conductors. In many applications the problem of access to the circuit board module for purposes of replacement of parts or repair thereof is of paramount importance. Thus, increasingly flexible means for interconnecting circuit boards is a primary design goal.

One approach to the interconnecting of circuit boards is disclosed in U.S. Pat. No. 3,971,127 to Giguere in which is described a method for coupling two circuit boards involving the cutting of an aperture in a circuit board, the bridging of the aperture with a flexible circuit tape bonded to one side of the board, perforating holes through the board and the flexible tape, inserting the leads of electrical components through the holes and in a conductive relationship to the conductors on the flexible circuit tape, and folding the circuit board in the area of the aperture after the two edges of the board in the area of the aperture after the two edges of the board adjacent to the aperture are cut through. Thus, the two adjacent, coupled circuit boards are linked by means of a flexible conductive tape. While this configuration provides flexibility in relative board orientation, the coupling lacks rigidity and fails to provide mutual circuit board support if necessary. Another approach to circuit board coupling is described in U.S. Pat. No. 3,716,846 to Volckart, et al which involves the folding of the margin of a circuit board along a line of perforations. Input and output connectors symmetrically arranged across the fold line form electrically connected contacts on the front and rear of the folded circuit board. In this manner a dual sided circuit board edge connector surface is formed from a single sided structure and is aligned to be in electrical contact with similar structures mutually aligned and mechanically clamped together. This arrangement is intended not to provide flexibility in circuit board mounting but to provide improved board coupling between vertically stacked, mechanically clamped boards.

Other techniques and methods used in electrically and mechanically coupling circuit boards are disclosed in U.S. Pat. Nos. 3,221,286 to Fedde and 3,376,479 to Wines, et al. Both patents disclose means for connecting printed circuit boards but are limited in their application to a stacked assembly of circuit boards in which the boards are mounted in a generally parallel direction which is not capable of being varied to suit a particular environment or application. Still another approach to circuit board coupling is disclosed in U.S. Pat. No. 2,910,628 to Keener but this conductor panel assembly is limited to mechanically coupled circuit boards which are assembled in fixed right angular relation with respect to one another. Finally, U.S. Pat. No. 3,780,430 to Feeney involves the mounting of an electroluminescent display in a hand-held calculator above the level of the keyboard and at an angle to the keyboard making it more transverse to the line of sight of the viewer. More particularly, conductor pins mounted on the keyboard printed circuit board are bent relative to the plane of the keyboard circuit board prior to insertion on the circuit board of the display at a predetermined angle which optimizes user viewing of the electroluminescent display. Various relative circuit board angles are available, but once the conductor pins are bent to provide a particular configuration subsequent re-orientation of the display is not possible. In addition, the thin conductor pins provide only limited support for the electroluminescent display mounted on the keyboard.

The present invention is intended to avoid these circuit board mounting limitations by providing an inexpensive, machine compatible, circuit board mounting configuration which permits the circuit boards to be mounted at various relative angles in a semi-rigid construction in which the conductors linking the circuit boards provide substantial inter-board support.

OBJECTS OF THE INVENTION

Accordingly, it is an object of the present invention to provide an improved means for structurally and electrically coupling circuit boards.

It is another object of the present invention to provide an improved system for flexibly coupling electrically connected circuit boards.

Still another object of the present invention is to provide an improved system for connecting circuit boards in which the electrical coupling means serve also as the mechanical coupling means and in which board inter-coupling means of reduced size are made possible.

A further object of the present invention is to provide a means for coupling circuit boards which permit the boards to be positioned relative to one another at any desired angle.

A still further object of the present invention is to provide a circuit board connector means therefore for the selective mounting of circuit boards in different orientations to accommodate a wide variety of installation environments.

Another object of the present invention is to provide a coupled circuit board configuration which is simple in construction, may be easily fabricated using existing automated procedures, and can be economically manufactured in large quantities possessing a large variety of coupled board orientations.

Another object of the present invention is to facilitate the alignment and testing of a combination of circuit boards prior to final assembly as an interconnected single unit.

BRIEF DESCRIPTION OF THE DRAWINGS

The appended claims set forth those novel features believed characteristic of the invention. However, the invention itself, as well as further objects and advantages thereof, will best be understood by reference to the following detail description of a preferred embodiment taken in conjunction with the accompanying drawings in which:

DESCRIPTION OF THE PREFERRED EMBODIMENT

Figure 1:
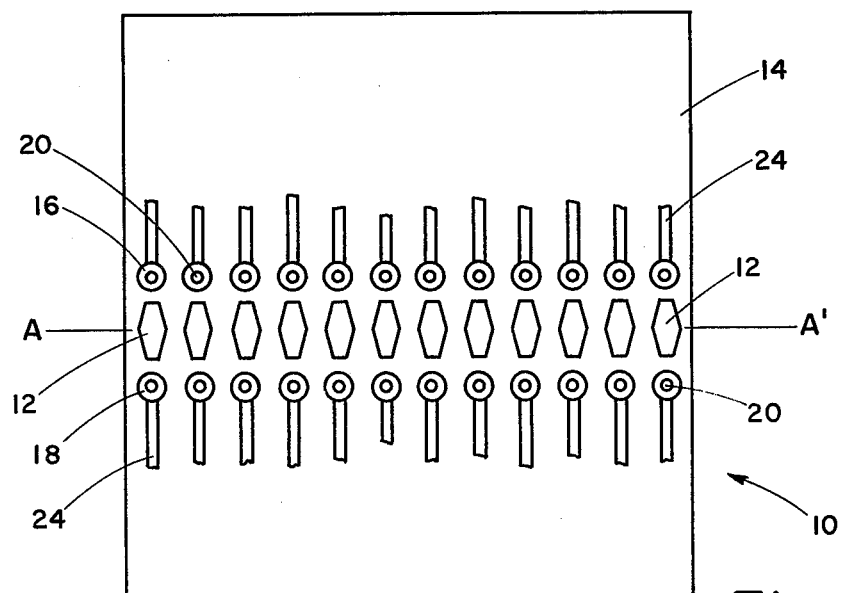
FIG. 1 is a top view illustrating a breakaway circuit board according to the present invention before bending of the circuit board along the linear perforations and prior to insertion of the jumper wire connectors.

Referring to FIGS. 1-4, there is shown a breakaway circuit board with flexible coupling 10 in accordance with the preferred embodiment of the present invention. A linear array of perforations 12 are incorporated in a standard circuit board 14. Parallel and adjacent to the perforations 12 is an array of paired contact portions 16 and 18. A pair of contact portions 16 and 18 are mounted on opposite sides of and adjacent to each perforation 12. Each contact portion 16 and 18 includes a hole 20 through which a jumper wire 22 may be inserted. Each contact or terminal portion is, in turn, connected to a conductor 24 which in combination form a circuit on board 14. Since the present invention is not limited to any particular circuit design and the circuit on board 14 does not itself form a part of the present invention, the particular conductor pattern present on board 14 will not be further discussed.

Perforations 12 and contact or terminal, holes 20 may be formed by any of the more common machine punch or stamping processes currently available although the present invention is not limited to such methods. Contact, or terminal, portions 16 and 18 are symmetrically aligned on each side of the linear array of perforations 12 and the A—A' axis defined by the perforations. Incorporation of the perforations in a linear arrangement weakens circuit board 14 along A—A' axis so that the board may be easily and precisely folded along the axis. Prior to folding circuit board 14 along axis A—A', jumper wires 22 are machine-inserted across paired contact portions 16 and 18. With the jumper wires 22 inserted through the terminal holes 20 in each contact portion, continued electrical contact is ensured by conventional contact soldering methods. In the preferred embodiment of the present invention, the jumper wires 22 are inserted by means of axial machine insertion techniques which permit high speed, simultaneous, multiple wire insertion. Following the insertion and soldering of jumper wires 22 and terminal portions 16 and 17, the board is folded along axis A—A' to the desired angle. With each jumper wire 22 coupled between paired terminal portions 16 and 18 and thus aligned along each perforation 12 therebetween, each jumper wire 22 is forced into the adjacent perforation 12. Each perforation 12 acts not only as a hinge mechanism but also as a wire guide and retainer for maintaining jumper wire separation thus preventing short circuits, stray current leakage, etc. The angular extent to which circuit board 14 can be bent depends primarily on the length of jumper wire 22 with increased jumper wire length permitting larger angular deformation of circuit board 14. Substantial rigidity may be provided to the bent circuit board configuration by determining the jumper wire lengths required for a desired angle of circuit board flexible coupling. In addition, by making the individual perforations 12 wider along axis A—A' than immediately adjacent to terminal portions 16 and 18, the jumper wires 22 may be precisely guided in the inter-contact space and increased board rigidity may be realized for the more unstable, large angular displacement configurations. This is possible because with increased angular displacement jumper wires bridging perforations 12 will encounter the reduced widths of the individual perforations resulting in a wedge effect on the jumper wires and the tendency for the bent board configuration to remain in the originally displaced configuration.

Figure 2:
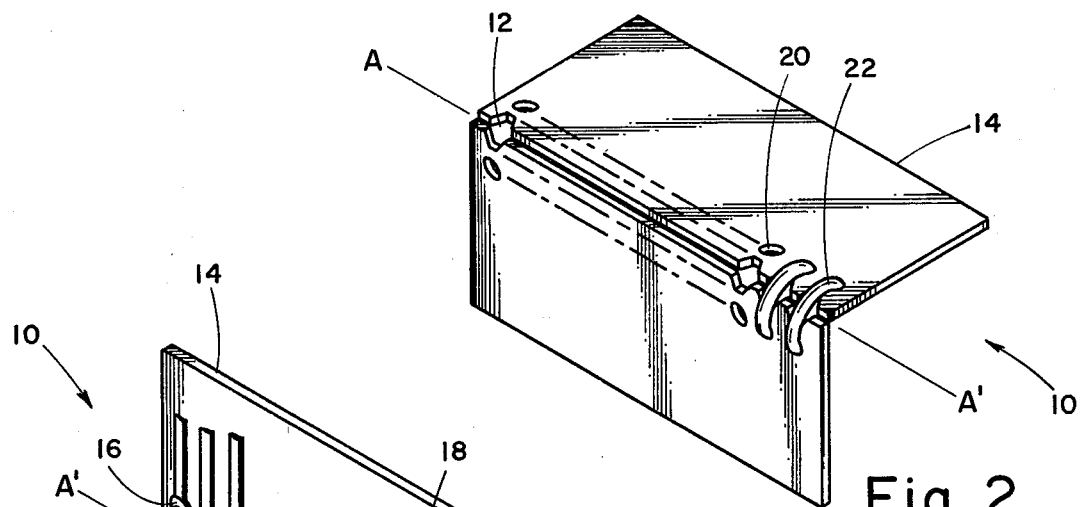
FIG. 2 is a perspective rear view of the breakaway circuit board shown in FIG. 1 following the bending of the board along the linear perforations and insertion of the jumper wire connectors.
Figure 3:
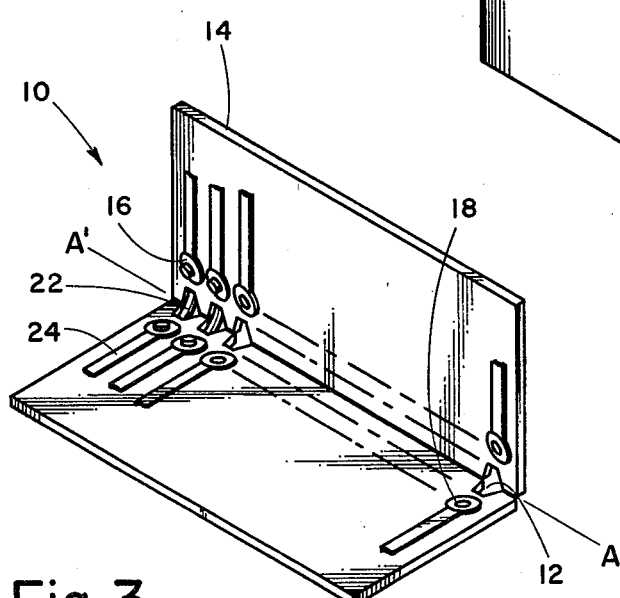
FIG. 3 is a front perspective view of the board assembly shown in FIG. 2 after the folding operation.
Figure 4:
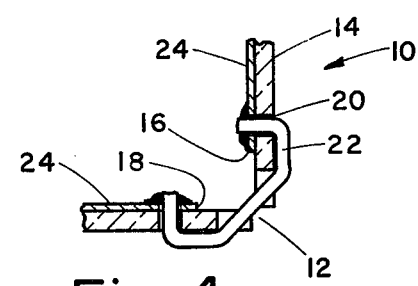
FIG. 4 is a cross-sectional view of the breakaway circuit board with flexible coupling following the deformation of the circuit board along the linear perforations and the insertion of the jumper wire connectors.

Substantial strength and rigidity are provided in the breakaway circuit board with flexible coupling of the present invention by jumper wires 22. Large numbers of such conductors, which may easily and quickly be inserted by means of an axial wire insertion machine, will provide correspondingly enhanced rigidity and ruggedness. The jumper wires are integrally connected to the circuit board in the present invention and provide a compact, rigid and flexible means for coupling adjacent circuit boards. It is not necessary for the circuit board to be bent to the absolutely maximum angular displacement permitted by the jumper wire length to achieve circuit board rigidity. Substantial stability in the breakaway circuit board configuration is available for any angular displacement of circuit board sections relative to one another. In addition, while FIGS. 2-4 show the circuit board 14 bent in a direction opposite to the side on which the jumper wires 22 are mounted on the circuit board, the circuit board may also be bent in the opposite direction, or in the direction of the jumper wires 22. While this configuration results in a reduction in circuit rigidity and ruggedness, it provides a stable, compact, economical and flexible circuit board coupling means.

While the invention has been illustrated and described as involving conductors on a single side of a circuit board it is obvious that the present invention would be equally applicable to a breakaway circuit board with flexible coupling in which conductors were located on both sides of the circuit board. Similarly, the present invention as described includes jumper wires inserted on only one side of the circuit board. However, the present invention will work equally as well where the jumper wires are inserted on both sides of the circuit board as, for example, where the jumper wires are inserted across alternating perforations on the same side of the board. This would permit equal flexibility and rigidity in both angular deflection directions. Finally, a plurality of linear arrays of perforations in combination with associated contact portions may be incorporated in a single circuit board. The circuit board may thus be subjected to a number of sectional angular displacements to provide a unique, flexible board configuration to fit a particular environment geometry.

There has thus been shown a perforated circuit board with a linear arrangement of terminals symmetrically positioned with respect to the perforations. Jumper wires connected to the terminals and bridging the perforations permit a flexible, rigid and compact means for connecting adjacent sections of the circuit board which has been bent along the perforations. The present invention thus avoids the use of an expensive flat cable assembly or a handwiring process to mechanically and electrically couple several circuit boards.

While particular embodiments of the invention have been shown and described, it will be obvious to those skilled in the art that changes and modifications will be made without departing from the invention in its broader aspects and, therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. A flexible circuit board including a plurality of first conductors positioned thereon comprising:
   a plurality of paired terminals connected to said first conductors and forming two parallel linear arrays on said circuit board, each of said terminals including an aperture passing through said circuit board;
   a plurality of elongated, double-tapered perforations in said circuit board defining an axis passing medially between paired terminals with each of said perforations positioned midway between each pair of said terminals, wherein each of said perforations is of varying width, with the widest portion being positioned on said axis and the narrowest portions located adjacent each of said terminals; and
   a plurality of second wire conductors inserted in the apertures of each of said paired terminals and electrically connected to said terminals by solder such that upon the bending of said circuit board along the axis defined by said perforations to a predetermined angular displacement, the two circuit board sections thus formed are maintained in semi-rigid self-supporting relative orientation with each of said second conductors guided into wedging contact with a respective perforation by the tapered edges thereof and wherein said two circuit board sections are electrically connected with the angular displacement between said two circuit board sections determined by the length of said second conductors between said paired terminals.

2. A flexible circuit board as in claim 1 wherein all of said second conductors are positioned on one surface of said circuit board.

3. A flexible circuit board as in claim 2 wherein the board is bent along said axis in a direction opposite to the surface on which said second conductors are located so that said second conductors are positioned in said perforations for interconductor isolation, with further angular displacement being opposed by contact between said second conductors and the edges of corresponding perforations.

4. A flexible circuit board as in claim 1 wherein said second conductors are jumper wires.

5. A flexible circuit board as in claim 4 wherein said jumper wires are axially inserted in said paired apertures.

6. A flexible circuit board as in claim 1 further including a plurality of linearly arrayed paired terminals and apertures, a plurality of associated perforations defining a plurality of non-intersecting axes, and associated second conductors to permit the bending of said circuit board along said plurality of non-intersecting axes to form a multi-plane circuit board comprising a plurality of electrically coupled sections maintained in semi-rigid relative orientation.

7. A flexible circuit board including a plurality of conductors positioned thereon comprising:
   a plurality of paired terminals connected to said conductors and forming two parallel linear arrays on said circuit board, each of said terminals including an aperture passing through said circuit board;
   a plurality of elongated perforations in said circuit board defining an axis passing medially between said paired terminals with each of said perforations positioned midway between each pair of said terminals and including tapered portions at each end thereof and adjacent said paired terminals with the widest portion of said perforations positioned along said axis; and
   a plurality of jumper wires positioned on one surface of said circuit board axially inserted in the apertures of each of said paired terminals and electrically connected to said terminals by solder such that upon the bending of said circuit board along the axis defined by said perforations in a direction opposite to the surface on which said jumper wires are located to a predetermined angular displacement, the two circuit board sections thus formed are maintained in semi-rigid relative orientation and in electrical contact, with said jumper wires being positioned in said perforations in electrical isolation from one another wherein said semi-rigid relative orientation is maintained by the guiding of said jumper wires into wedging contact with the edges of respective perforations by means of the tapered end portions thereof.

8. A flexible circuit board having a plurality of first conductors thereon and a plurality of elongated, double-tapered perforations each having a center portion wider than the end portions thereof and forming a linear array including interstitial elements between said perforations therein and thus defining an axis on said circuit board comprising:
   a plurality of paired terminals connected to said first conductors and symmetrically positioned on each side of said axis so as to form two parallel linear arrays, each of said paired terminals being adjacent to an end portion of a perforation;
   an aperture in each of said terminals, said aperture extending through the underlying portion of said circuit board; and
   a plurality of second wire conductors inserted in the apertures of each of said paired terminals and electrically connected to said terminals by solder such that upon the bending of said circuit board along the axis defined by said perforations to a predetermined angular displacement, the interstitial elements are partially broken with the second conductors being positioned in an adjacent perforation and inter-connector isolation being maintained by said interstitial elements, with the two circuit board sections thus formed being maintained in semi-rigid, self-supporting relative orientation by the wedged engagement of said second conductors with the tapered edges of respective perforations and electrically connected, with said predetermined angular displacement determined by the length of said second conductors between said paired terminals.

* * * * *